(12) United States Patent
Ng et al.

(10) Patent No.: US 8,198,170 B2
(45) Date of Patent: Jun. 12, 2012

(54) SEMICONDUCTOR DEVICE FABRICATION METHOD FOR IMPROVED ISOLATION REGIONS AND DEFECT-FREE ACTIVE SEMICONDUCTOR MATERIAL

(75) Inventors: Man Fai Ng, Poughkeepsie, NY (US); Bin Yang, Mahwah, NJ (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 40 days.

(21) Appl. No.: 12/905,805

(22) Filed: Oct. 15, 2010

(65) Prior Publication Data

US 2012/0094466 A1    Apr. 19, 2012

(51) Int. Cl.
    *H01L 21/762* (2006.01)
(52) U.S. Cl. .................. 438/426; 438/481; 257/E21.546
(58) Field of Classification Search .................. 438/426, 438/481; 257/E21.546
    See application file for complete search history.

(56) References Cited

U.S. PATENT DOCUMENTS

| 6,271,143 | B1 * | 8/2001 | Mendicino | 438/700 |
| 2011/0201172 | A1 * | 8/2011 | Chew et al. | 438/424 |
| 2012/0025309 | A1 * | 2/2012 | Chen et al. | 257/339 |

OTHER PUBLICATIONS

U.S. Appl. No. 12/775,863, filed May 7, 2009.

* cited by examiner

*Primary Examiner* — George Fourson, III
(74) *Attorney, Agent, or Firm* — Ingrassia Fisher & Lorenz, P.C.

(57) ABSTRACT

A fabrication method for a semiconductor device structure is provided. The device structure has a layer of silicon and a layer of silicon dioxide overlying the layer of silicon, and the method begins by forming an isolation recess by removing a portion of the silicon dioxide and a portion of the silicon. The isolation recess is filled with stress-inducing silicon nitride and, thereafter, the silicon dioxide is removed such that the stress-inducing silicon nitride protrudes above the silicon. Next, the exposed silicon is thermally oxidized to form silicon dioxide hardmask material overlying the silicon. Thereafter, a first portion of the silicon dioxide hardmask material is removed to reveal an accessible surface of the silicon, while leaving a second portion of the silicon dioxide hardmask material intact. Next, silicon germanium is epitaxially grown from the accessible surface of the silicon.

16 Claims, 7 Drawing Sheets

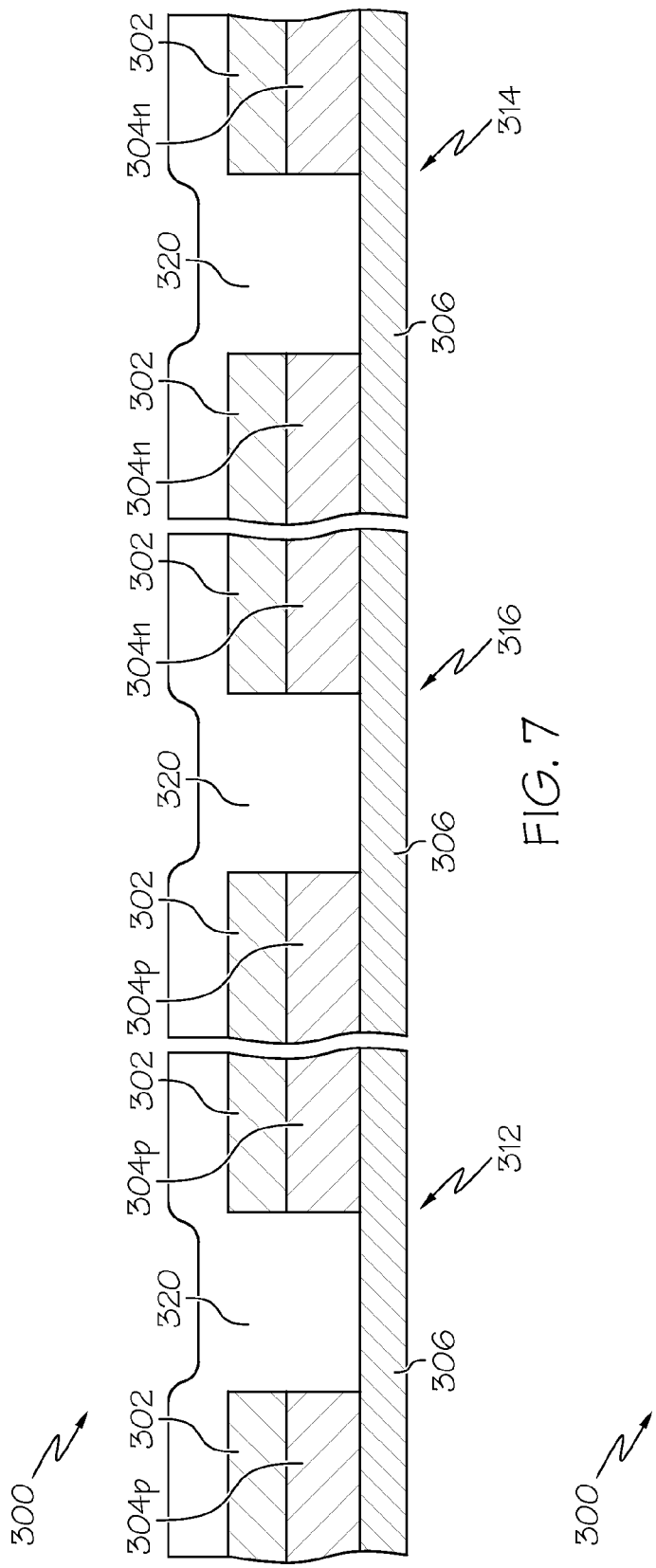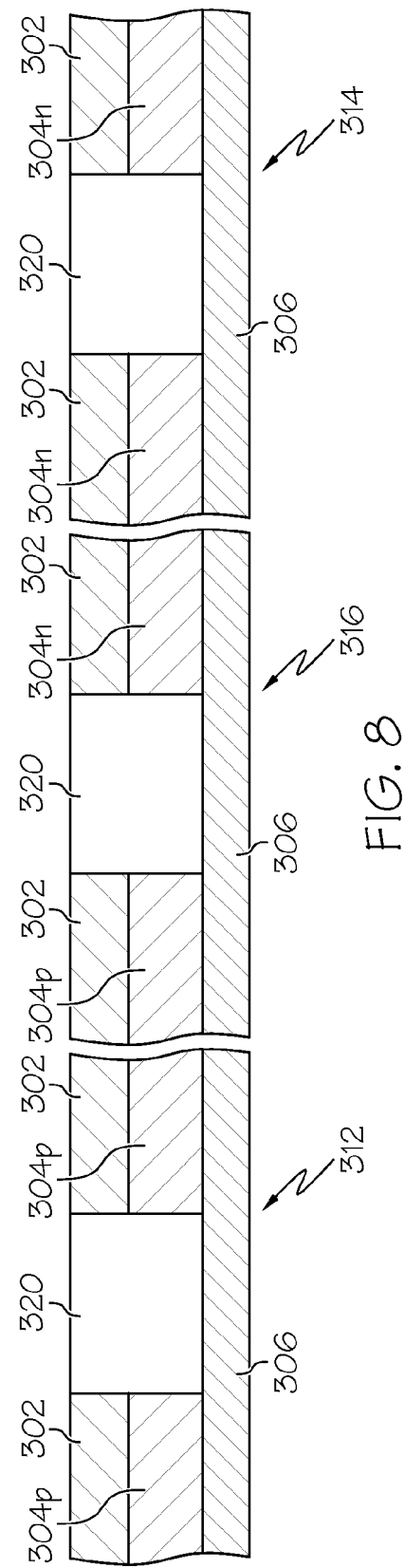

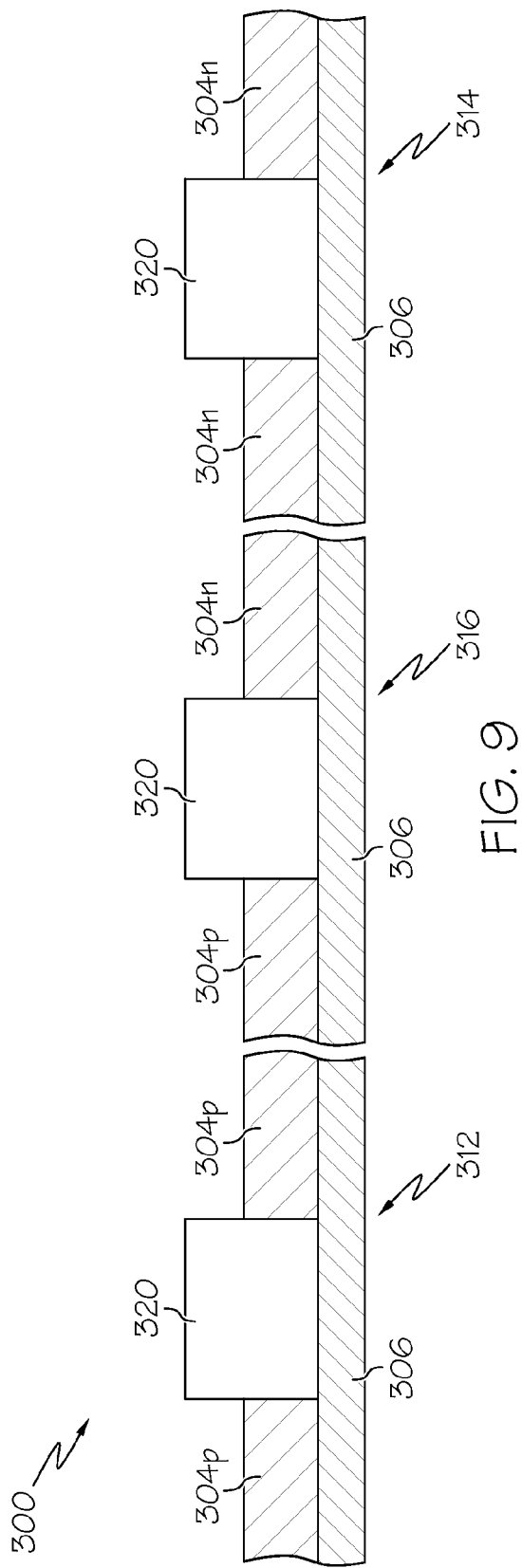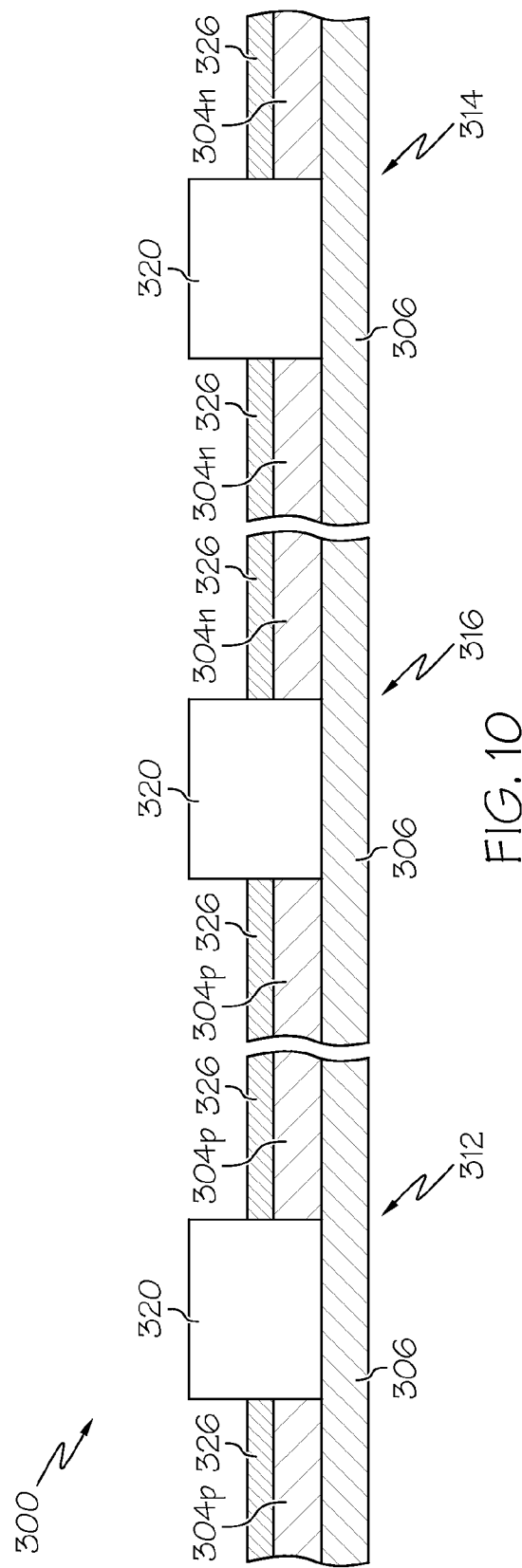

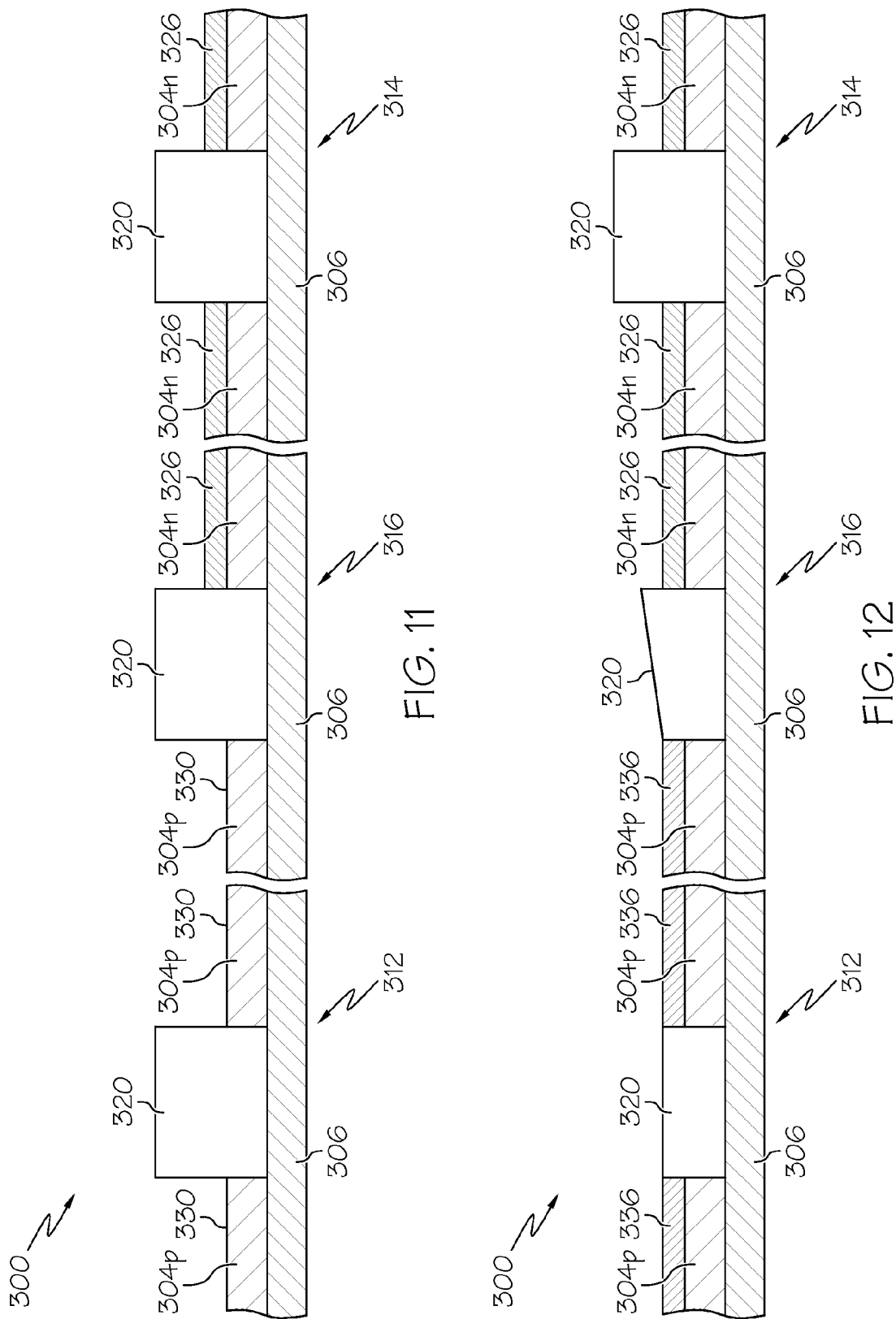

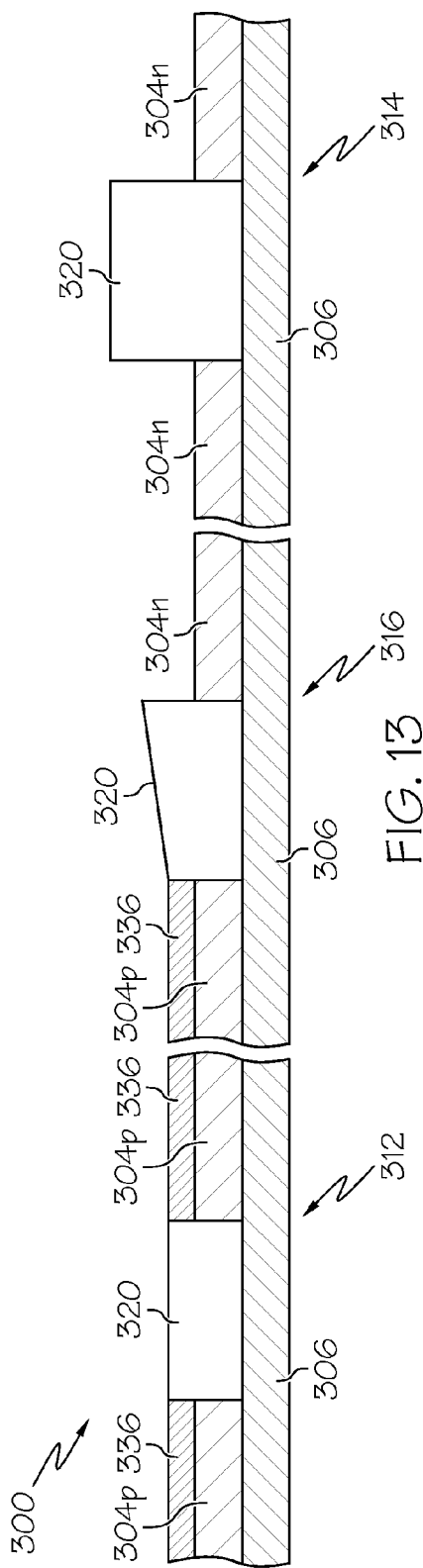
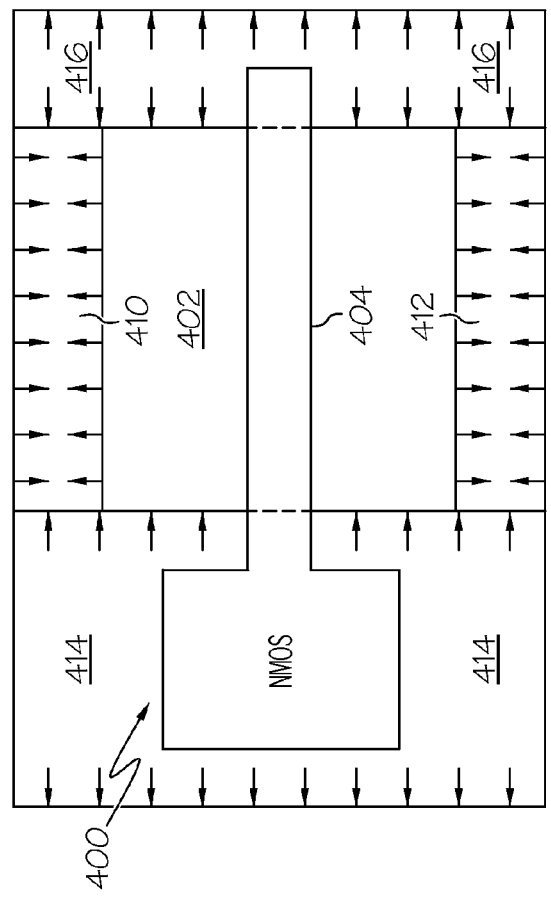
FIG. 13
FIG. 14

US 8,198,170 B2

SEMICONDUCTOR DEVICE FABRICATION METHOD FOR IMPROVED ISOLATION REGIONS AND DEFECT-FREE ACTIVE SEMICONDUCTOR MATERIAL

TECHNICAL FIELD

Embodiments of the subject matter described herein relate generally to semiconductor device fabrication. More particularly, embodiments of the subject matter relate to an enhanced shallow trench isolation technology that effectively eliminates the adverse effects of divots caused by etching, and results in defect-free silicon areas.

BACKGROUND

The majority of present day integrated circuits (ICs) are implemented by using a plurality of interconnected field effect transistors (FETs), which may be realized as metal oxide semiconductor field effect transistors (MOSFETs or MOS transistors). A MOS transistor may be realized as a p-type device (i.e., a PMOS transistor) or an n-type device (i.e., an NMOS transistor). Moreover, a semiconductor device can include both PMOS and NMOS transistors, and such a device is commonly referred to as a complementary MOS or CMOS device. A MOS transistor includes a gate electrode as a control electrode that is formed over a semiconductor substrate, and spaced-apart source and drain regions formed within the semiconductor substrate and between which a current can flow. The source and drain regions are typically accessed via respective conductive contacts formed on the source and drain regions. Bias voltages applied to the gate electrode, the source contact, and the drain contact control the flow of current through a channel in the semiconductor substrate between the source and drain regions beneath the gate electrode. Conductive metal interconnects (plugs) formed in an insulating layer are typically used to deliver bias voltages to the gate, source, and drain contacts.

A semiconductor device structure may include any number of active transistor regions, which are electrically isolated from one another using some form of isolation material, arrangement, or structures. For example, insulating material in the form of shallow trench isolation (STI) is commonly used to separate active semiconductor regions from each other. In practice, the creation of STI regions usually results in the formation of "divots" in the STI material. These divots are located where the STI meets the active silicon material. STI divots can be problematic in modern semiconductor device fabrication processes, particularly those that involve the use of high-k metal gate (HKMG) technologies.

BRIEF SUMMARY

A fabrication method for a semiconductor device structure is provided. The method begins by forming an oxide material overlying a semiconductor material. The method continues by removing a portion of the oxide material and a portion of the semiconductor material to form an isolation recess, and filling the isolation recess with an isolation material. After filling the isolation recess with the isolation material, the method selectively etches away the oxide material, without etching the semiconductor material. This exposes the semiconductor material such that the isolation material protrudes above the semiconductor material. The method continues by oxidizing the exposed semiconductor material to form an oxide hardmask overlying the semiconductor material. A section of the oxide hardmask is selectively etched, without etching the semiconductor material. This results in an exposed section of the semiconductor material. Thereafter, epitaxial material is selectively grown overlying the exposed section of the semiconductor material.

Also provided is a fabrication method for a semiconductor device structure having a layer of silicon and a layer of silicon dioxide overlying the layer of silicon. The method forms an isolation recess by removing a portion of the silicon dioxide and a portion of the silicon. The method continues by filling the isolation recess with stress-inducing silicon nitride and, thereafter, removing the silicon dioxide from the silicon such that the stress-inducing silicon nitride protrudes above the silicon. Next, the exposed silicon is thermally oxidized to form silicon dioxide hardmask material overlying the silicon. The method continues by removing a first portion of the silicon dioxide hardmask material to reveal an accessible surface of the silicon, while leaving a second portion of the silicon dioxide hardmask material intact. Thereafter, the method selectively grows epitaxial silicon germanium from the accessible surface of the silicon.

A method of fabricating a semiconductor device structure is also provided. The method involves: forming one or more isolation recesses in a layer of semiconductor material to define an active region of semiconductor material that is flanked by the one or more isolation recesses; and filling each of the one or more isolation recesses with respective stress-inducing isolation material that imparts mechanical stress to the active region of semiconductor material.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 5-13 are cross sectional views that illustrate the fabrication of a semiconductor device; and FIG. 14 is a schematic top view of a transistor device, its active semiconductor region, and surrounding stress-inducing isolation material.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

The techniques and technologies described herein may be utilized to fabricate a semiconductor device having one or more transistor devices, typically, metal-oxide-semiconductor (MOS) transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

The semiconductor device fabrication process described here relates to the formation of STI regions in a way effectively eliminates the adverse effects of STI divots at the STI edge. The process also results in substantially defect-free silicon germanium channel (c-SiGe) material overlying the active silicon material, improves the performance of HKMG CMOS transistors, and facilitates the use of stress-inducing STI material that further enhances CMOS performance.

Figure 1:
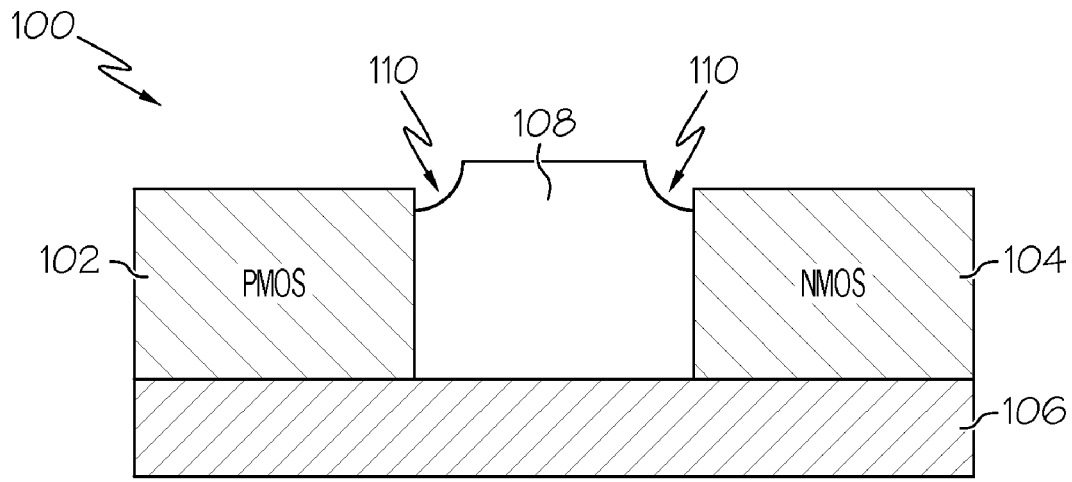
FIG. 1 is a cross sectional view of a semiconductor device structure at an intermediate stage of a conventional fabrication process.
Figure 2:
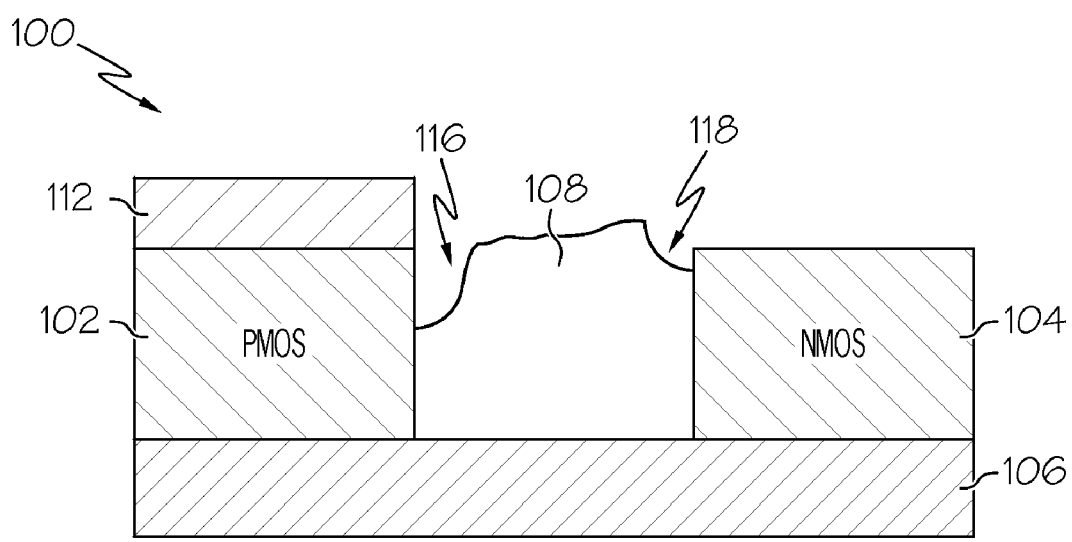
FIG. 2 is a cross sectional view of the semiconductor device of FIG. 1, at a later stage of the conventional fabrication process.

One potential problem caused by STI divots is metal gate erosion, which can occur at or near the junction of the STI divot and the adjacent active silicon region. In this regard, due to practical manufacturing tolerances and limitations, the HKMG stack might extend beyond the active silicon material and into the STI divot. This, in turn, can lead to high leakage and unsatisfactory performance. For small scale processes (such as 32 nm or 28 nm process nodes) with gate-first HKMG integration schemes, the effect of STI divots can be more severe relative to older node technologies (such as 45 nm). This is due to the addition of a c-SiGe epitaxial process and, more specifically, the associated pre-clean and wet etches. In this regard, FIG. 1 is a cross sectional view of a semiconductor device structure 100 at an intermediate stage of a conventional fabrication process, and FIG. 2 is a cross sectional view of the semiconductor device structure 100 after completion of the c-SiGe process. The semiconductor device structure 100 includes two active regions of silicon material 102, 104 overlying a layer of insulating material 106. For this example, the silicon material 102 represents the active semiconductor region for one or more PMOS transistors, and the silicon material 104 represents the active semiconductor region for one or more NMOS transistors. The two active regions of silicon material 102, 104 are separated by an isolation trench that has been filled with an STI material 108. Relatively symmetrical and equal-depth STI divots 110 are formed as a result of the STI process steps, as is well understood.

FIG. 2 depicts the semiconductor device structure 100 after completion of a c-SiGe epitaxial growth process. In this regard, silicon germanium material 112 is selectively grown overlying the silicon material 102 to be used for the PMOS transistors (the silicon material 104 to be used for the NMOS transistors is protected by an appropriate mask during the c-SiGe process). In practice, the c-SiGe process results in an appreciably deeper STI divot 116 adjacent the silicon material 102, as compared to the STI divot 118 adjacent the silicon material 104. In some implementations, the STI divot 116 at the PMOS side is about 30-40 nm deep, while the STI divot 118 at the NMOS side is only about 10-15 nm deep. Unfortunately, STI divots cannot be easily avoided using conventional STI process technology such as that described above. Accordingly, it would be desirable to have an effective and reliable divot-free STI process.

Figure 3:
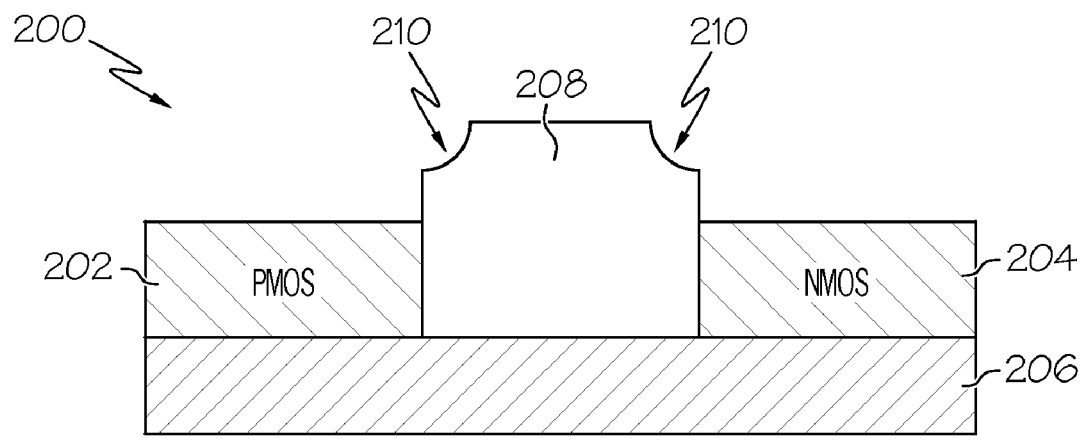
FIG. 3 is a cross sectional view of another semiconductor device at an intermediate stage of an exemplary fabrication process.
Figure 4:
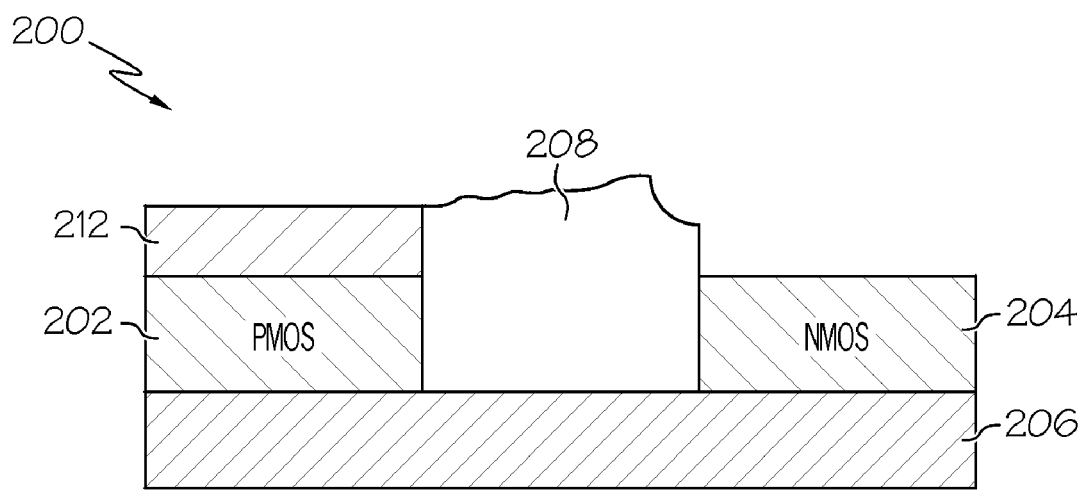
FIG. 4 is a cross sectional view of the semiconductor device of FIG. 3, at a later stage of its fabrication process.

An approach known as "recessed channel c-SiGe" has been developed as a way to effectively eliminate the STI divot at the PMOS side. This technique recesses the active silicon material by etching, such that the resulting height of the silicon material is below the STI divots. Thereafter, the c-SiGe is formed such that the STI divots have little to no impact on the PMOS transistors. This approach is illustrated in FIG. 3, which is a cross sectional view of a semiconductor device structure 200 at an intermediate stage of an exemplary fabrication process, and FIG. 4 is a cross sectional view of the semiconductor device structure 200 after completion of the c-SiGe process. It should be appreciated that the semiconductor device structure 200 may resemble that shown in FIG. 1 at a previous stage in the fabrication process. Accordingly, the semiconductor device structure 200 includes active regions of silicon material 202, 204 overlying a layer of insulating material 206, and the silicon material 202, 204 is separated by STI material 208. Next, the active regions of silicon material 202, 204 are selectively etched to lower their height, such that more of the STI material 208 is exposed (see FIG. 3). As shown in FIG. 3, the lowermost portions of the STI divots 210 reside above the exposed surfaces of the silicon material 202, 204 after the silicon etch step.

FIG. 4 depicts the semiconductor device structure 200 after completion of the c-SiGe epitaxial growth process. In this regard, silicon germanium material 212 is selectively grown overlying the silicon material 202 to be used for the PMOS transistors, while the silicon material 204 is protected by an appropriate mask. The silicon germanium material 212 is grown to the desired thickness, preferably at or below the resulting height of the STI material 208 (some of which is etched during the c-SiGe process steps). In contrast to that depicted in FIG. 2, this approach eliminates or substantially reduces the STI divot at the PMOS side. An exemplary embodiment of this process is described in U.S. patent application Ser. No. 12/775,863, filed May 15, 2009 (the relevant content of this patent application is incorporated by reference herein).

The "recessed channel c-SiGe" approach is beneficial in that it effectively eliminates STI divots at the PMOS active regions. In certain situations, however, the etching of the active silicon material (during the recess step) creates surface defects in the silicon material. In turn, such surface defects may be magnified or otherwise exacerbated during c-SiGe growth, resulting in undesirable surface defects in the resulting c-SiGe material. With this in mind, the enhanced fabrication process described below provides a solution that effectively eliminates STI divots for PMOS active regions without introducing silicon surface defects.

Figure 5:
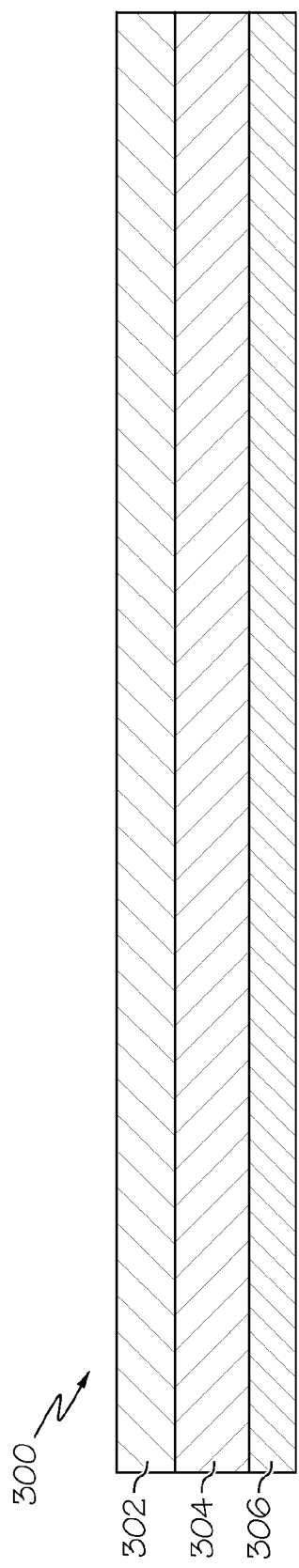

FIG. 5 depicts the state of a semiconductor device structure 300 after formation of an oxide material 302 overlying a semiconductor material 304. The semiconductor material 304 is preferably a silicon material as typically used in the semiconductor industry, e.g., relatively pure silicon as well as silicon admixed with other elements such as germanium, carbon, and the like. Alternatively, the semiconductor material 304 can be germanium, gallium arsenide, or the like. The semiconductor material 304 can be either N-type or P-type, but is typically P-type, with wells of the appropriate type formed therein. The semiconductor material 304 may be provided as a bulk semiconductor substrate, or it could be provided on a semiconductor-on-insulator (SOI) substrate, as depicted in FIGS. 5-13. Accordingly, the semiconductor material 304 resides on a layer of insulating material 306, which is usually referred to as a buried oxide layer.

For this example, the oxide material 302 is silicon dioxide, and it can be formed using any suitable technique or technology, such as conformal deposition. In this regard, the oxide material 302 is deposited overlying the semiconductor material 304 to the desired thickness. After formation of the layer of oxide material 302, the process continues by forming isolation recesses 310 (see FIG. 6). The isolation recesses 310 are formed by removing certain portions of the oxide material 302 and certain portions of the semiconductor material 304. In practice, the isolation recesses 310 are formed by selectively etching the oxide material 302 and the semiconductor material 304, and without etching the underlying insulating material 306. In this regard, the fabrication process may leverage well known techniques and steps related to the creation of a patterned etch mask (e.g., material deposition, photolithography, selective etching of mask material to form the patterned etch mask) and related to etching of the oxide material 302 and the semiconductor material 304.

Figure 6:
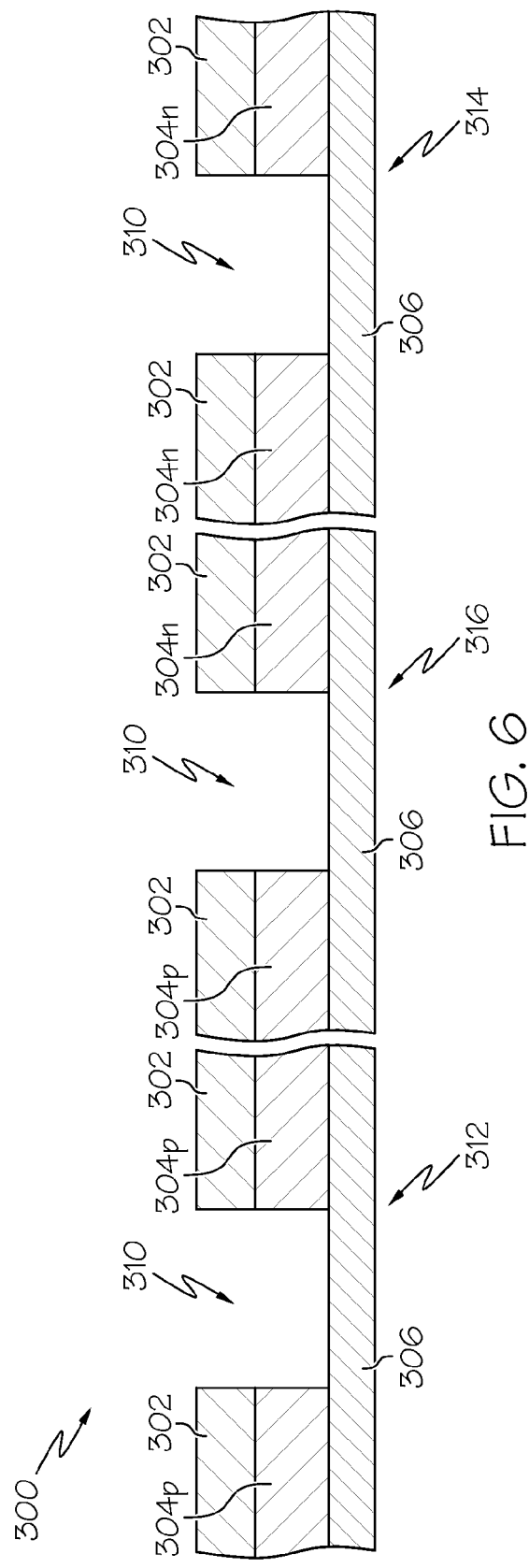

The isolation recesses 310 are used to define and separate distinct active semiconductor regions. In practice, the isolation recesses 310 can be arranged to flank or surround one or more active semiconductor regions, which in turn could be used to fabricate any number of transistor devices. Depending upon the desired transistor layout to be created on the semiconductor device structure 300, a given isolation recess 310 could be used to separate two active semiconductor regions to be used for PMOS devices (i.e., PMOS regions), two active semiconductor regions to be used for NMOS devices (i.e., NMOS regions), or one PMOS region and one NMOS region. FIG. 6 schematically depicts these different layout configurations. More specifically, the left portion 312 of the semiconductor device structure 300 includes regions of semiconductor material 304p that are designated as PMOS regions, and the right portion 314 of the semiconductor device structure 300 includes regions of semiconductor material 304n that are designated as NMOS regions. The center portion 316 of the semiconductor device structure 300, however, includes one region of semiconductor material 304p designated as a PMOS region, and one region of semiconductor material 304n designated as an NMOS region.

Although other fabrication steps or sub-processes may be performed after the isolation recesses 310 have been created, this example continues by filling the isolation recesses with an isolation material 320 (see FIG. 7). In practice, the isolation recesses 310 are filled by depositing the isolation material 320 using an appropriate technique. This allows the isolation material 320 to completely fill the isolation recesses 310 in an effective manner. Although traditional STI techniques commonly use silicon dioxide as isolation material, the preferred embodiments described here use a silicon nitride material as the isolation material 320 for etch selectivity reasons that will become apparent from the following description.

In certain embodiments, the isolation material 320 is a stress-inducing silicon nitride material that imparts mechanical stress to its adjacent active regions of semiconductor material 304. Thus, the isolation material 320 might be a tensile silicon nitride material, a compressive silicon nitride material, or a stress-neutral silicon nitride material, depending upon the type of transistor devices (NMOS or PMOS), the layout and orientation of the channel regions, the shape, size, and arrangement of the isolation regions relative to the channel regions, and/or other factors. Moreover, different types of stress-inducing silicon nitride material could deposited in different isolation recesses 310 if so desired (using multiple deposition steps). For example, the isolation material 320 used to fill the isolation recesses 310 in the left portion 312 of the semiconductor device structure 300 could be realized as a compressive silicon nitride material that imparts a compressive mode of mechanical stress to the active semiconductor material 304p. Such compressive stress can be transferred to the channel regions of the PMOS transistors formed using the active semiconductor material 304p, and such compressive stress has been found to improve PMOS transistor performance by increasing the mobility of holes in the channel of PMOS transistors. Conversely, the isolation material 320 used to fill the isolation recesses 310 in the right portion 314 of the semiconductor device structure 300 could be realized as a tensile silicon nitride material that imparts a tensile mode of mechanical stress to the active semiconductor material 304n. Such tensile stress can be transferred to the channel regions of the NMOS transistors formed using the active semiconductor material 304n, and such tensile stress has been found to improve NMOS transistor performance by increasing the mobility of electrons in the channel of NMOS transistors. It should be appreciated that compressive and/or tensile material could be arranged in a desired layout as needed to address the particular needs and performance characteristics of the semiconductor devices, and that the above examples are not meant to be limiting or exhaustive.

It should be appreciated that some tradeoffs or performance compromises may be associated with the use of stress-inducing isolation material 320 in the center portion 316 of the semiconductor device structure 300, because the center portion 316 is flanked by one region of semiconductor material 304p that is intended for PMOS transistors, and another region of semiconductor material 304n that is intended for NMOS transistors. Consequently, although compressive isolation material 320 might enhance the performance of the PMOS transistors formed using the semiconductor material 304p, that compressive isolation material 320 could be detrimental (or neutral) to the performance of the neighboring NMOS transistors. Likewise, although tensile isolation material 320 might enhance the performance of the NMOS transistors formed using the semiconductor material 304n, that tensile isolation material 320 could be detrimental (or neutral) to the performance of the neighboring PMOS transistors. In such scenarios, therefore, it may be desirable to instead use a neutral-stress silicon nitride material. Alternatively, it may be desirable to utilize other techniques to derive benefits for both NMOS and PMOS devices. For instance, certain embodiments may use different types of stress-inducing material to fill an isolation recess in multiple steps. As another example, it may be possible to perform certain post-deposition processes to treat the isolation material 320, e.g., ion implantation.

To ensure that all of the isolation recesses 310 are completely filled, the isolation material 320 might be deposited such that some amount of overfill results. As shown in FIG. 7, some of the isolation material 320 will typically be deposited overlying the upper surface of the oxide material 302. Accordingly, the fabrication process may continue by polishing the isolation material 320 until it is coplanar with the oxide material 302 (see FIG. 8). Polishing the isolation material 320 can be performed using, for example, chemical mechanical polishing with an appropriate endpoint detection technique that stops the polishing once the layer of oxide material 302 has been reached. This polishing step removes the overburden portion of the isolation material 320, and exposes the upper surface of the oxide material 302.

The fabrication process continues by selectively removing the oxide material 302 from the underlying semiconductor material 304, using a suitable technique that does not damage or otherwise create surface defects in the underlying semiconductor material 304 (see FIG. 9). In this regard, the oxide material 302 can be etched away using an appropriate etching technique and etching chemistry that is highly selective to the oxide material 302, i.e., the underlying semiconductor material 304 is not etched or otherwise damaged during this etching step. For this exemplary embodiment, a wet etchant (such as a hydrofluoric acid based etchant) is used to remove the oxide material 302. Notably, this selective etching step exposes the semiconductor material 304 such that the isolation material 320 protrudes above the semiconductor material 304, as depicted in FIG. 9. Thus, the upper surface of the isolation material 320 is higher than the upper surface of the semiconductor material 304, even though some of the nitride isolation material 320 might get etched away (at a lower etch rate) while the oxide material 302 is etched. Consequently, the oxide material 302 and the silicon nitride isolation material 320 are etched at different rates such that divots are not formed at the edges of the isolation material 320.

Although other fabrication steps or sub-processes may be performed after the oxide material 302 has been removed, this example continues by oxidizing the exposed semiconductor material 304 to form a hardmask from oxide material 326 (see FIG. 10). This hardmask will be formed overlying the semiconductor material 304, as shown in FIG. 10. In certain embodiments, the semiconductor material 304 is thermally oxidized such that the oxide material 302 is silicon dioxide. Thermal oxidation is preferred here because the oxide material 302 is formed from the underlying semiconductor material 304 in such a way that creates a defect-free underlying silicon surface, as is well understood. Thermal oxidation processes are well known in the semiconductor manufacturing industry, and will not be described in detail here. During thermal oxidation, oxygen is introduced into a high temperature environment such that the oxygen reacts with the exposed silicon surface, thus "converting" some of the silicon into silicon dioxide. Consequently, although there might be some "growth" during thermal oxidation, the isolation material 320 remains protruding above the resulting upper surface of the oxide material 326, as shown in FIG. 10.

The hardmask created from the oxide material 326 is used to protect selected portions of the underlying semiconductor material 304. Accordingly, the fabrication process continues by removing a first portion of the oxide material 326, while leaving a second portion of the oxide material 326 intact (see FIG. 11). For this example, the oxide material 326 overlying the semiconductor material 304$p$ is removed, and the oxide material 326 overlying the semiconductor material 304$n$ remains intact. Selective removal of the oxide material 326 in this manner reveals an accessible (exposed) surface 330 of the semiconductor material 304$p$. In practice, the oxide material 326 is removed by selectively etching the desired sections of the oxide material 326 without etching the underlying semiconductor material 304$p$. In this regard, the fabrication process may leverage well known techniques and steps related to the creation of a patterned etch mask (e.g., material deposition, photolithography, selective etching of mask material to form the patterned etch mask) and related to etching of the oxide material 326. More specifically, an etch mask can be fabricated such that it overlies and protects the sections of oxide material 326 overlying the semiconductor material 304$n$, while leaving the sections of oxide material 326 overlying the semiconductor material 304$p$ exposed. Thus, the etch mask will protect the sections of oxide material 326 overlying the semiconductor material 304$n$ during selective etching of the oxide material 326 overlying the semiconductor material 304$p$.

The etching technique and etch chemistry used to remove the hardmask oxide material 326 do not damage or otherwise create surface defects in the underlying semiconductor material 304. Thus, the oxide material 326 is preferably etched in a manner that is highly selective to the oxide material 326. For this exemplary embodiment, a wet etchant (such as a hydrofluoric acid based etchant) is used to remove the oxide material 326. Although some of the exposed isolation material 320 might also get etched (at a lower etch rate), the isolation material 320 remains above the upper surface of the remaining oxide material 326, as shown in FIG. 11.

After removing the desired sections of the oxide material 326, the fabrication process continues by selectively growing epitaxial material 336 overlying the exposed section of the semiconductor material 304 (see FIG. 12). For this particular embodiment, silicon germanium is selectively and epitaxially grown from the accessible surface 330 of the semiconductor material 304$p$ to the desired thickness. In this regard, the silicon germanium is formed during a selective epitaxial growth process, in which process parameters are selected in accordance with well-established recipes such that material growth is restricted to the exposed semiconductor material 304$p$ (conversely, growth of the epitaxial material 336 elsewhere is strongly suppressed). For this example, the epitaxial material 336 corresponds to c-SiGe regions for PMOS regions.

In practice, the epitaxial growth process may result in a profile that resembles that shown in FIG. 12. In particular, some of the isolation material 320 may be etched, resulting in changes to its height and upper surface profile. In this regard, the height of the isolation material 320 for the left portion 312 of the semiconductor device structure 300 is approximately the same as the height of the adjacent epitaxial material 336. In contrast, the height and profile of the isolation material 320 in the right portion 314 of the semiconductor device structure 300 remains substantially unchanged because the right portion 314 was not subjected to the epitaxial growth process. The isolation material 320 in the center portion 316 of the semiconductor device structure 300 exhibits a tapered profile that is indicative of the epitaxial growth process for only the semiconductor material 304$p$.

After formation of the epitaxial material 336, the fabrication process continues by removing the hardmask oxide material 326 from the semiconductor material 304$n$ (see FIG. 13). As mentioned above, the etching technique and etch chemistry used to remove the hardmask oxide material 326 do not damage or otherwise create surface defects in the underlying semiconductor material 304. Moreover, this etching step is selective to the oxide material 326, and it leaves the epitaxial material 336 intact.

Thereafter, any number of known process steps can be performed to complete the fabrication of at least one transistor device (e.g., one or more PMOS transistors, one or more NMOS transistors, or a combination of both). Notably, PMOS transistor devices will utilize the semiconductor material 304$p$ as active material, and NMOS transistor devices will utilize the semiconductor material 304$n$ as active material.

For the sake of brevity, conventional process steps and the resulting transistor devices are not shown or described here.

The fabrication process described above has several advantages over conventional processes. For example, the active semiconductor material is not etched to form isolation recesses, which results in defect-free surfaces, including those from which c-SiGe is grown. Moreover, the use of silicon nitride as the STI material can significantly improve the "width effect" associated with HKMG transistor devices, which is important for threshold voltage variability control. In this regard, conventional oxide STI is an oxygen source that can cause CMOS interfacial layer re-growth along the device width direction. Conversely, with silicon nitride as the STI material, the oxygen source is effectively eliminated.

Another benefit relates to the use of stress-inducing silicon nitride for the STI material. Unlike conventional oxide-based STI material, silicon nitride can be "customized" to be stress-inducing in different modes (neutral, tensile, or compressive). Consequently, stress-inducing silicon nitride can be used to improve narrow width NMOS or PMOS device performance with the proper selection of stress around a specific transistor device in the STI region in both longitudinal and transverse directions. Indeed, silicon nitride STI stressors could potentially be a significant performance booster considering the smaller and smaller device widths contemplated for future CMOS processes, indicating increasing device sensitivity to the STI edge stress, especially in the transverse (width) direction.

In practice, an active semiconductor region of an NMOS transistor could be surrounded by neutral silicon nitride STI material, tensile silicon nitride STI material, or a combination of tensile silicon nitride STI and compressive silicon nitride STI. For example, FIG. 14 is a schematic top view of a transistor device 400, its active semiconductor region 402, and surrounding stress-inducing isolation material. In FIG. 14, the active semiconductor region 402 has a square shaped perimeter (in reality, the shape of the active semiconductor region 402 need not be square). The horizontal feature represents the gate structure 404 of the transistor device 400, which overlies and crosses over the active semiconductor region 402. Notably, the channel region of the transistor device 400 generally corresponds to the gate structure 404, as is well understood. In FIG. 14, therefore, the channel length dimension corresponds to the north-south (vertical) dimension, while the channel width dimension corresponds to the east-west (horizontal) dimension.

For this embodiment, the stress-inducing isolation material is segmented into four different regions: a first parallel isolation region 410; a second parallel isolation region 412; a first perpendicular isolation region 414; and a second perpendicular isolation region 416. The two parallel isolation regions 410, 412 are arranged to be parallel to the longitudinal aspect of the gate structure 404. Consequently, the parallel isolation regions 410, 412 flank the active semiconductor region 402 along the channel width dimension. Conversely, the two perpendicular isolation regions 414, 416 are arranged to be perpendicular to the orientation of the gate structure 404. Therefore, the perpendicular isolation regions 414, 416 flank the active semiconductor region 402 along the channel length dimension.

The two parallel isolation regions 410, 412 are preferably formed from stress-inducing silicon nitride having a first stress-inducing characteristic that imparts a first mode of mechanical stress to the channel region of the transistor device 400, in the channel length dimension. The two perpendicular isolation regions 414, 416, however, are preferably formed from stress-inducing silicon nitride having a second stress-inducing characteristic that imparts a second mode of mechanical stress to the channel region of the transistor device 400, in the channel width dimension. For example, if the transistor device 400 is realized as an NMOS transistor, then the parallel isolation regions 410, 412 can be realized using tensile silicon nitride that "pulls" on the active semiconductor region 402 (as depicted by the outward facing arrows at the edge of the active semiconductor region 402). In contrast, the perpendicular isolation regions 414, 416 can be realized using compressive silicon nitride that "pushes" on the active semiconductor region 402 (as depicted by the inward facing arrows at the edge of the active semiconductor region 402).

It should be recognized that the parallel isolation regions 410, 412 could be formed before the perpendicular isolation regions 414, 416, or vice versa. In this regard, isolation recesses for one or more initial isolation regions can be formed and thereafter filled in the manner described above, while using appropriate masks to protect the areas corresponding to other isolation regions. Thereafter, isolation recesses for one or more other isolation regions can be formed and subsequently filled, while using masks to protect the previously filled isolation regions. Sequential formation of different isolation regions in this manner may be utilized to create STI around an active region, where the STI has different stress-inducing modes in different locations.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A fabrication method for a semiconductor device structure, the method comprising:
   forming an oxide material overlying a semiconductor material;
   removing a portion of the oxide material and a portion of the semiconductor material to form an isolation recess;
   filling the isolation recess with an isolation material;
   after filling the isolation recess with the isolation material, selectively etching away the oxide material, without etching the semiconductor material, to expose the semiconductor material such that the isolation material protrudes above the semiconductor material;
   oxidizing exposed semiconductor material to form an oxide hardmask overlying the semiconductor material;
   selectively etching a section of the oxide hardmask, without etching the semiconductor material, resulting in an exposed section of the semiconductor material; and
   selectively growing epitaxial material overlying the exposed section of the semiconductor material.

2. The method of claim 1, wherein:
   the semiconductor material is a silicon material; and
   forming the oxide material overlying the semiconductor material comprises depositing silicon dioxide overlying the silicon material.

3. The method of claim 1, wherein filing the isolation recess with the isolation material comprises depositing a silicon nitride material in the isolation recess.

4. The method of claim 3, wherein the silicon nitride material is a tensile silicon nitride material.

5. The method of claim 3, wherein the silicon nitride material is a compressive silicon nitride material.

6. The method of claim 1, wherein oxidizing the exposed semiconductor material comprises thermally oxidizing the exposed semiconductor material.

7. The method of claim 1, wherein:
- selectively etching the section of the oxide hardmask comprises selectively etching a first portion of the oxide hardmask, without etching a second portion of the oxide hardmask;
- the first portion of the oxide hardmask overlies a first portion of the semiconductor material that is to be utilized as active material for p-type field-effect transistor devices; and
- the second portion of the oxide hardmask overlies a second portion of the semiconductor material that is to be utilized as active material for n-type field-effect transistor devices.

8. The method of claim 1, wherein selectively growing epitaxial material comprises selectively growing silicon germanium overlying the exposed section of the semiconductor material.

9. The method of claim 1, further comprising fabricating at least one transistor device using the semiconductor material as active material.

10. A fabrication method for a semiconductor device structure having a layer of silicon and a layer of silicon dioxide overlying the layer of silicon, the method comprising:
- forming an isolation recess by removing a portion of the silicon dioxide and a portion of the silicon;
- filling the isolation recess with stress-inducing silicon nitride;
- thereafter, removing the silicon dioxide from the silicon such that the stress-inducing silicon nitride protrudes above the silicon;
- thereafter, thermally oxidizing exposed silicon to form silicon dioxide hardmask material overlying the silicon;
- thereafter, removing a first portion of the silicon dioxide hardmask material to reveal an accessible surface of the silicon, while leaving a second portion of the silicon dioxide hardmask material intact; and
- thereafter, selectively growing epitaxial silicon germanium from the accessible surface of the silicon.

11. The method of claim 10, wherein filling the isolation recess comprises:
- depositing stress-inducing silicon nitride in the isolation recess; and
- polishing the stress-inducing silicon nitride until it is coplanar with the silicon dioxide.

12. The method of claim 10, wherein removing the silicon dioxide from the silicon comprises selectively etching the silicon dioxide, without etching any underlying silicon.

13. The method of claim 10, wherein removing the first portion of the silicon dioxide hardmask material comprises selectively etching the first portion of the silicon dioxide hardmask material, without etching any underlying silicon.

14. The method of claim 13, wherein removing the first portion of the silicon dioxide hardmask material comprises fabricating an etch mask overlying the second portion of the silicon dioxide hardmask material such that the etch mask leaves the first portion of the silicon dioxide hardmask material exposed, and such that the etch mask protects the second portion of the silicon dioxide hardmask material during the step of selectively etching the first portion of the silicon dioxide hardmask material.

15. The method of claim 10, wherein the stress-inducing silicon nitride comprises tensile silicon nitride.

16. The method of claim 10, wherein the stress-inducing silicon nitride comprises compressive silicon nitride.

* * * * *